United States Patent [19]
Floyd et al.

[11] Patent Number: 5,917,216
[45] Date of Patent: *Jun. 29, 1999

[54] TRENCHED FIELD EFFECT TRANSISTOR WITH PN DEPLETION BARRIER

[75] Inventors: Brian H. Floyd, Sunnyvale; Dorman C. Pitzer, San Ramon; Fwu-Iuan Hshieh, Saratoga; Mike F. Chang, Cupertino, all of Calif.

[73] Assignee: Siliconix incorporated, Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/742,326

[22] Filed: Oct. 31, 1996

Related U.S. Application Data

[63] Continuation of application No. 08/386,620, Feb. 10, 1995, abandoned.

[51] Int. Cl.⁶ ............... H01L 29/76; H01L 29/94; H01L 31/062
[52] U.S. Cl. ............. 257/330; 257/331; 257/334
[58] Field of Search ............... 257/330, 331, 257/332, 333, 334, 403

[56] References Cited

U.S. PATENT DOCUMENTS

| | | | |
|---|---|---|---|
| 4,434,433 | 2/1984 | Nishizawa | 357/22 |
| 4,791,462 | 12/1988 | Blanchard et al. | 257/331 |
| 4,835,586 | 5/1989 | Cogan | 357/23.14 |
| 4,914,058 | 4/1990 | Blanchard | 437/203 |
| 5,021,845 | 6/1991 | Hashimoto | 357/23.4 |
| 5,164,325 | 11/1992 | Cogan et al. | 437/29 |
| 5,168,331 | 12/1992 | Yilmaz | 257/331 |
| 5,177,572 | 1/1993 | Murakami | 257/330 |
| 5,350,934 | 9/1994 | Matsuda | 257/139 |
| 5,405,794 | 4/1995 | Kim | 437/41 |
| 5,410,170 | 4/1995 | Bulucea et al. | 257/331 |
| 5,430,315 | 7/1995 | Rumennik | 257/331 |
| 5,473,176 | 12/1995 | Kakumoto | 257/330 |
| 5,474,943 | 12/1995 | Hshieh et al. | 437/40 |
| 5,488,236 | 1/1996 | Baliga et al. | 257/132 |

FOREIGN PATENT DOCUMENTS

| | | | |
|---|---|---|---|
| 0 583 023 | 2/1994 | European Pat. Off. | |
| 3-195064 | 8/1991 | Japan | 257/330 |

OTHER PUBLICATIONS

K. Sunouchi et al. "A Surrounding Gate Transistor (SGT) Cell for 64/256 Mbit DRAM s," IEDM Technical Digest 1989, pp. 2.1.1–2.1.4.

S. Watanabe et al. "A Novel Circuit Technology with Surrounding Gate Transistor (SGT's) for Ultra High Density DRAM's," IEEE Journal of Solid–State Circuits, vol. 30, No. 9, Sep. 1995, pp. 960–970.

(List continued on next page.)

*Primary Examiner*—Wael Fahmy
*Attorney, Agent, or Firm*—Skjerven, Morrill, MacPherson, Franklin & Friel LLP; Norman R. Klivans

[57] ABSTRACT

A trenched MOSFET in its on-state conducts current through an accumulation region and through an inverted depletion barrier layer located along the trench sidewalls. Blocking is achieved by gate control depletion of the adjacent region and by the depletion barrier layer (having the appearance of "ears" in a cross sectional view and being of opposite doping type to the adjacent region) which extends laterally from the trench sidewalls into the drift region. This MOSFET has superior on-state specific resistance to that of prior art trenched MOSFETs and also has good performance in terms of on state resistance, while having superior blocking characteristics to those of prior art trenched MOSFETs. The improvement in the blocking characteristic is provided by the depletion barrier layer which is a semiconductor doped region. In the blocking state, the depletion barrier layer is fully or almost fully depleted to prevent parasitic bipolar conduction. The shape and extent of the depletion barrier layer may be varied and more than one depletion barrier layer may be present.

14 Claims, 8 Drawing Sheets

OTHER PUBLICATIONS

Mader, H., "Electrical Properties of Bulk–Barrier Diodes," *IEEE Transactions on Electron Devices,* vol. ED–29, No. 11, Nov. 1982, pp. 1766–1771.

Mader, H., et al., "Bulk–Barrier Transistor," *IEEE Transactions on Electron Devices,* vol. ED–30, No. 10, Oct. 1983, pp. 1380–1386.

McCowen, A., et al., "Gate controlled bulk–barrier mechanism in an MOS power transistor," *IEEE Proceedings,* vol. 134, Pt. I, No. 6, Dec. 1987, pp. 165–169.

Baliga, B., et al., "The Accumulation–Mode Field–Effect Transistor: A New Ultralow On–Resistance MOSFET," *IEEE Electron Device Letters,* vol. 13, No. 8, Aug. 1992, pp. 427–429.

Syau, T., et al., "Comparison of Ultralow Specific On–Resistance Umosfet Structures: The ACCUFET, EXTFET, INVFET, and Conventional UMOSET's," *IEEE Transactions on Electron Devices,* vol. 41, No. 5, May 1994, pp. 800–808.

TRENCHED FIELD EFFECT TRANSISTOR WITH PN DEPLETION BARRIER

This application is a continuation of application Ser. No. 08/386,620, filed Feb. 10, 1995, now abandoned.

BACKGROUND OF THE INVENTION

1. Field Of The Invention

This invention pertains to transistors, and more specifically to a field effect transistor having its gate electrode located in a trench and being suitable for use in integrated circuits or as a discrete component, especially for use as a power transistor.

2. Description Of The Prior Art

Field effect transistors (FETs) are well known, as are power MOS (metal oxide semiconductor) field effect transistors (MOSFETs); such transistors are often used for power applications, i.e. where high voltage is applied. There is a need for power MOSFET transistors with very low on-state resistance ($R_{DS\ (on)}$) for applications where high voltage must be switched. For instance, for a power supply for an integrated circuit, an output rectifier supports 20 volts for a 3.3 volt output and 10 volts for a 1.5 volt output. Typically, Schottky rectifiers are used but these disadvantageously have forward voltage drops of about 0.5 volts, which degrades the efficiency of the power supply.

A power MOSFET should have the lowest possible on-state specific resistance to minimize conduction losses. On-state resistance is a well known parameter of the efficiency of a power switching transistor and is a ratio of drain to source voltage to drain current when the device is fully turned on. On-state specific resistance refers to resistance times cross sectional area of the substrate carrying the drain current.

Figure 1A:
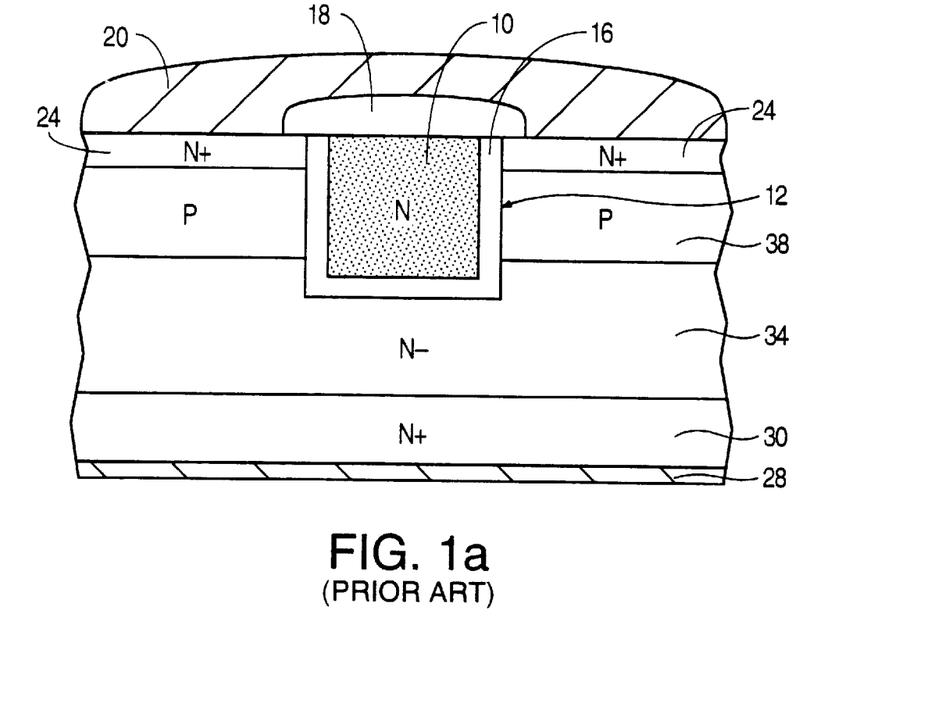
FIG. 1a shows a prior art N-channel MOSFET.

A typical prior art N-channel trenched MOSFET is shown in FIG. 1a, having conductive gate electrode 10 typically being N doped polycrystalline silicon (N type polysilicon) which is doped to be conductive serving as a gate electrode and located in a trench 12, the floor and sidewalls of which are insulated by a layer of gate oxide 16. Oxide layer 18 insulates the upper portion of gate electrode 10. The metallized source contact 20 contacts both the N+ doped source region 24 formed in the upper portion of the device and the P doped body region 38. The drain electrode 28 is a metallized contact to the N+ drain region 30 at the bottom surface of the device.

Formed overlying the N+ drain region 30 is an N− doped drift region 34 typically formed by epitaxy (hence an epitaxial layer) and being the drift region. The upper portion of the epitaxial layer is P doped to form the body region 38 and the very upper portion of the epitaxial layer is N+ doped to form the source region 24. It is to be understood that this transistor is typically formed in a silicon wafer and moreover there are a number of gate trenches 12 arranged (in a plan view) in rectangles, circles, hexagons, or linear structures, each defining a cell and all cells typically having a common source contact and a common gate contact.

In this case, to achieve high blocking capability, the trench 12 extends only partly through the N− doped drift region 34 and does not extend into the N+ doped drain region 30. The blocking state (off-state) is ordinarily the state when the transistor is off, i.e. not conducting current, and a measure of blocking capability is leakage current. Ideally, leakage current is zero. This transistor has an inferior on-state specific resistance to the ideal due to the substantial resistance of the N-doped drift region 34 below the trench.

Figure 1B:
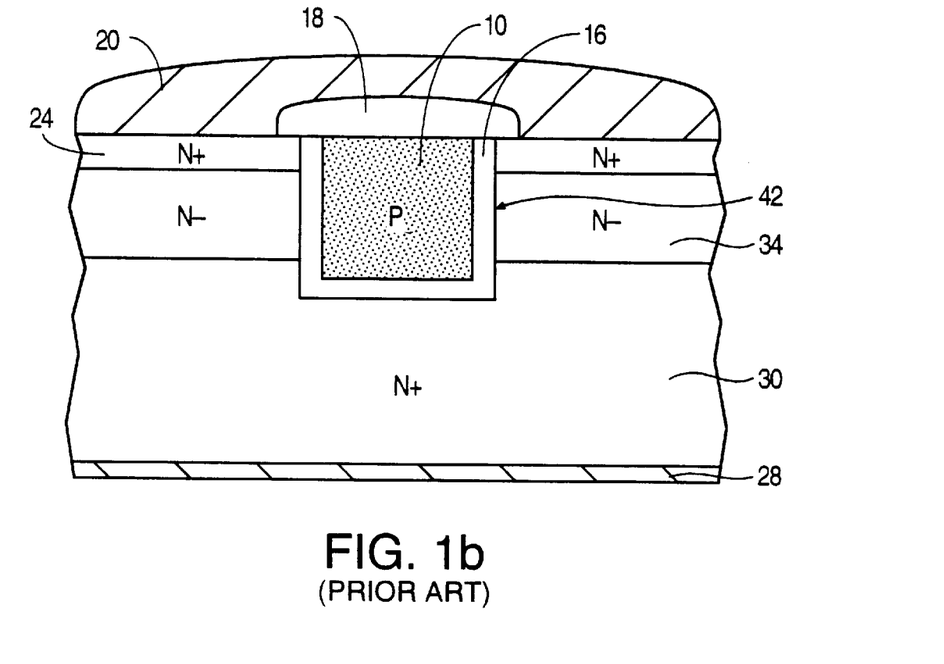
FIG. 1b shows a prior art ACCUFET.

An improvement over the prior art MOSFET of FIG. 1a is shown in FIG. 1b, which shows an N-channel device called the ACCUFET as described in "The Accumulation Mode Field Effect Transistor: A New UltraLow On-Resistance MOSFET" by Baliga et al., IEEE ELECTRON DEVICE LETTERS, Vol. 13, No. 8, August 1992.

The ACCUFET is an ultra-low on-state specific resistance vertical channel power MOSFET structure which uses current conduction via an accumulation layer formed on the surface of the trench gate structure. The ACCUFET does not contain a P body region 38, unlike the transistor of FIG. 1a, and the gate trench 42 extends all the way into the highly doped drain region 30. To achieve blocking the polysilicon is P doped and the N-region 34 is very lightly doped. For instance, the optimum N− drift region doping for a conventional MOSFET of FIG. 1a is typically $2\times10^{16}/cm^3$, while in the ACCUFET the N− region doping is typically below $10^{14}/cm^3$. The doping type of the conventional MOSFET polysilicon gate electrode is typically N-type, and not P-type. The ACCUFET on-state specific resistance is 105 micro-ohm $cm^2$ at a gate bias of 15 volts. Thus the ACCUFET is described as having an on-state specific resistance which is the lowest attainable for any known MOS gate-control device. Moreover, the ACCUFET is bidirectional, i.e. reversal of the source and drain contacts in use is available.

However, the ACCUFET blocking characteristics are less than might be desired, and negative gate voltages are required to reduce leakage current to acceptable levels.

Thus, it would be desirable to improve performance over both the prior art MOSFET of FIG. 1a and the ACCUFET of FIG. 1b in terms of the combined parameters of on-state specific resistance and blocking characteristics.

SUMMARY

In accordance with the invention, a trenched semiconductor device includes relatively lightly doped regions having in cross section the shape of "ears" formed extending laterally from the trench sidewalls, intermediate of the source region and the trench floors. These ears are of opposite doping type to that of the adjacent region and have typical doping concentration of $10^{13}$ to $10^{18}/cm^3$. In the off-state, the ears are a PN depletion barrier layer, and in the on-state they become inverted at the surface of the trench gate structure. Thus, the device conducts current through the accumulation region and the inverted depletion barrier region at the surface of the trench gate structure. Blocking is achieved in the off-state by gate control depletion of the adjacent N-region and by the PN depletion barrier layer. The doping type of the polysilicon gate electrode, like that of the ACCUFET, is opposite to that of the source region and drain region.

Advantageously, this device has been found to have superior on-state specific resistance to that of a conventional MOS trench device, with an on-state specific resistance similar to that of the ACCUFET. The present device has superior voltage blocking characteristics to those of the ACCUFET due to the inclusion of the depletion barrier layer, and, unlike the ACCUFET, acceptable levels of leakage current are maintained at zero gate bias. Additionally, the present device has bidirectional characteristics with pentode characteristics obtainable with current flow from drain to source when $V_{DS}$ (source-drain voltage) is greater than zero, and with current flow from source to drain when $V_{DS}$ is less than zero.

In the blocking state the PN depletion barrier layer is fully or almost fully depleted; thus, the undesirable properties of a floating, undepleted PN junction are avoided. In the conventional N-channel MOSFET the PN junction is part of a parasitic NPN transistor which, if not effectively shorted, will lead to device destruction if current is generated by avalanche breakdown. Avalanche breakdown occurs when voltages, and hence electric fields, become large enough to create large amounts of hole-electron current due to impact ionization. The blocking characteristics of the present device are determined by barrier-limited majority carrier current flow and not by avalanche breakdown. Thus, unlike the conventional MOSFET, the present PN junction may float, i.e. remain unshorted, availing bidirectional characteristics.

Advantageously, the depletion barrier layer may be of various shapes and in various locations between the source region (which is near the semiconductor device principal surface) and the drain region (which is at the lower portion of the semiconductor device). The depletion barrier layer may be located immediately below the source region or adjacent the trench floors or intermediate thereof. The depletion barrier layer may extend all the way from one trench to an adjacent trench or only part way, so long as it is located near the sidewalls of each trench. There may be multiple such depletion barrier layers stacked vertically. The depletion barrier layer may be of various widths and heights and doping levels.

In one version, the depletion barrier layer is formed by a double trench etch process in which the gate trenches are etched to a first depth. Then the depletion barrier layer is implanted through the trench floors and driven in to extend laterally into the substrate. Then a second etch step deepens the trenches, eliminating the portion of the driven-in implant at the trench floors and leaving only the "ears" adjacent to the newly etched trench sidewalls. The device is then completed conventionally.

In another embodiment, the depletion barrier layer is located immediately below the source region and is formed instead by implanting the depletion barrier layer with a high energy implant, followed by etching the trench through the implant. This leaves only the "ear" regions of the implant serving as the depletion barrier layer. This process does not require the double trench etch of the other process. Other processes also may be used for fabricating the presently disclosed structures.

BRIEF DESCRIPTION OF THE DRAWINGS

Similar reference numbers in various figures refer to identical or similar structures.

DETAILED DESCRIPTION OF THE PREFERRED EMBODIMENTS

Figure 2:
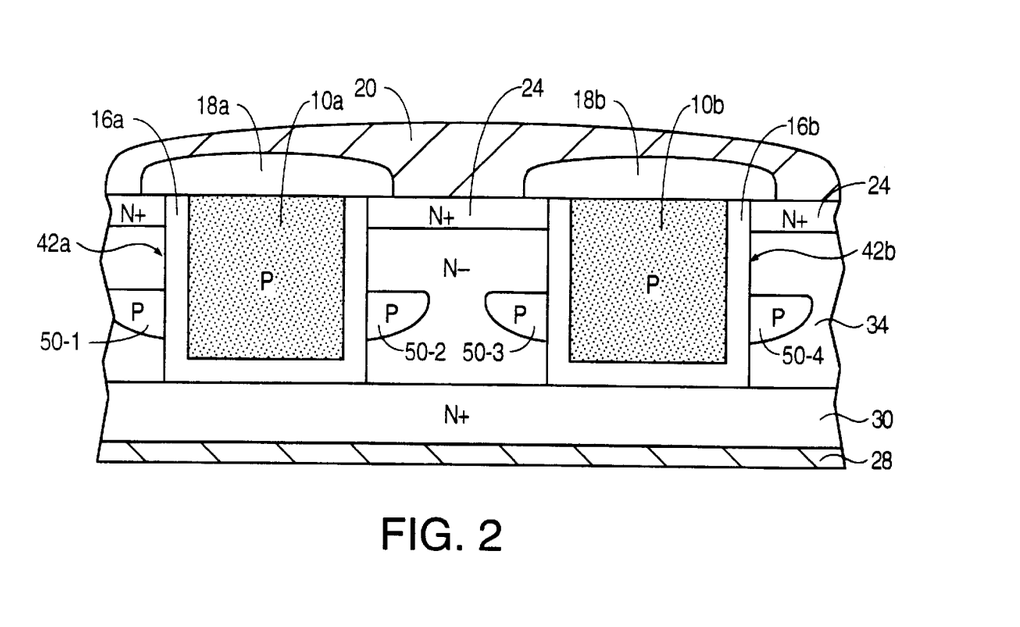
FIG. 2 shows in cross section an N-channel MOSFET in accordance with the present invention.

FIG. 2 shows a cross-section of a trenched N-channel MOSFET in accordance with the present invention. It is to be understood that FIG. 2, like the other figures herein, is not to scale and that furthermore the various doped semiconductor regions shown herein, which are shown as precisely defined regions delineated by lines, are conventional representations of doped regions having gradient dopant levels at their edges. Moreover, as is well known in the art and described above, typically power MOSFETs include a large number of cells, the cells having various shapes such as square, circular, hexagonal, linear or others. These cells are evident in a top side view (not provided here); in terms of cell layout, the present MOSFETs are conventional and may be fabricated in any one of a number of well known cell structures. The present depictions are therefore typically of only one cell or a portion of two cells as delineated by the gate trenches, and are not intended to illustrate an entire power transistor which would typically include hundreds or thousands of such cells.

Moreover, certain well known elements of such trenched MOSFETs are not shown herein. For instance, the metallization which connects to the gate electrodes is typically not shown as being outside the plane of the present cross sectional drawings. Also the termination portions of the transistors are also not shown as being outside the area depicted in the drawings; these terminations are conventional (ACCUFET-type) except as described below.

The N-channel MOSFET of FIG. 2 is in most respects similar to that of the N-channel ACCUFET of FIG. 1b (and referred to by identical reference numbers) with the important addition of the P doped depletion barrier layer regions extending from the sidewalls of the trenches into the drift region and having a P-doped polysilicon gate electrode. In this case, the depletion barrier layer for each trench 42a,42b is in two portions respectively 50-1, 50-2 and 50-3, 50-4 which appear in cross section to be "ears" extending from the trench sidewalls. This barrier layer 50-1, 50-2, 50-3, 50-4 is a major distinction between the MOSFET of FIG. 2 and the prior art ACCUFET.

Figure 3:
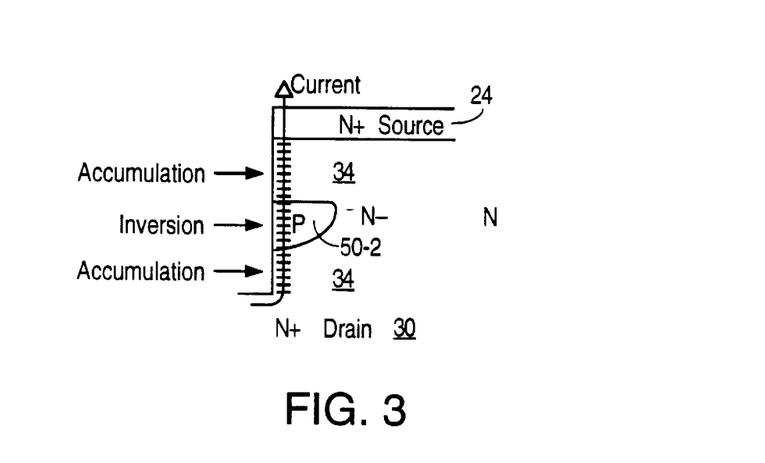
FIG. 3 shows current conduction in the MOSFET of FIG. 2.

This barrier layer provides the advantage of surface conduction as depicted in the FIG. 3, which is depicted along the FIG. 2 MOSFET trench sidewall and shows current flow for the on-state conduction path from the N+ doped drain region 30 through the accumulation region, through the inversion region (formed within the depletion barrier layer) layer 50-2 through the upper accumulation region, through the upper portion of the lightly doped drift region 34 through the N+ source region 24 to the N+ source region contact 20.

Figure 4:
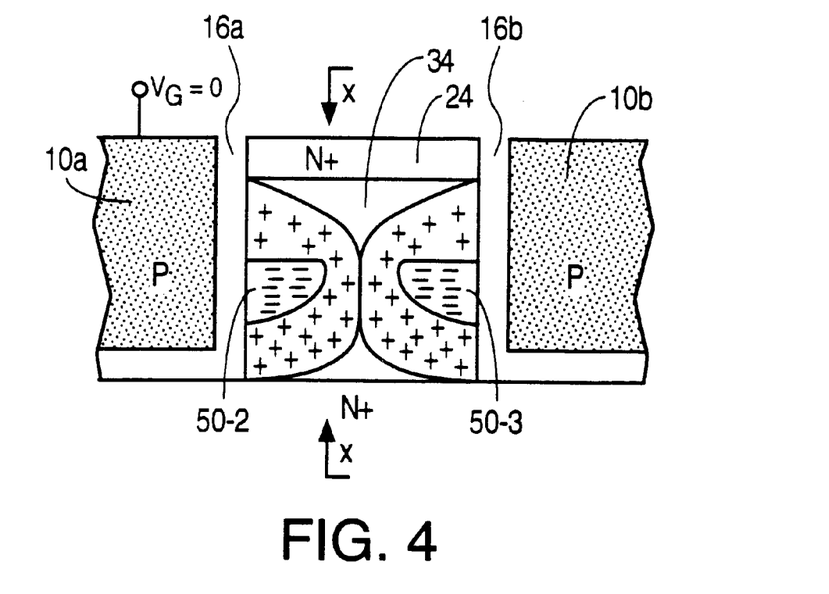
FIG. 4 shows a depletion profile of the MOSFET of FIG. 2.

Operation of the device of FIG. 2 in the blocking state, i.e., where $V_{GS}$ is equal to zero, is depicted in FIG. 4, showing the depletion region in the P depletion barrier layer (negative charge) and in the N− region (positive charge).

Figure 5:
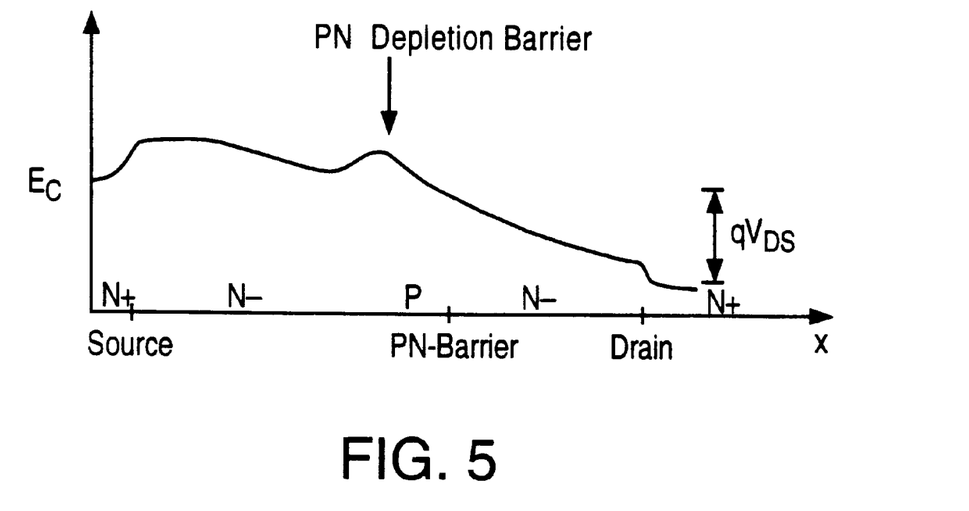
FIG. 5 shows a conduction band barrier profile of the MOSFET of FIG. 2.

A corresponding conduction band barrier profile with $V_{DS}$ greater than zero and $V_{GS}$ equal to zero is shown in FIG. 5, where the vertical axis is the energy $E_C$ and the horizontal axis is the linear dimension along line XX in FIG. 4.

The various semiconductor regions along line XX are labeled on the horizontal axis in FIG. 5. As can be seen, the PN depletion barrier layer (designated "PN-barrier") provides a conduction band energy "hump" in the blocking state, hence advantageously reducing leakage current and improving (increasing) blocking voltage. The indication "$qV_{DS}$" of the right hand side of FIG. 5 indicates the total energy is a function of charge (q) multiplied by $V_{DS}$. In this case the depletion barrier layer is totally depleted. Thus the typical undesirable parasitic NPN transistor which appears in a prior art MOSFET as in FIG. 1a is not present here, due to depletion.

It has been found that advantageously a MOSFET including the present depletion barrier layer and gate electrode doping type exhibits significant improvement in blocking voltage capability compared to the ACCUFET for instance. An ACCUFET has been compared to the present MOSFET, at a blocking voltage of 15 volts. The leakage current for the ACCUFET was found to be approximately 10 times greater than that for the present MOSFET. To put this another way, for the ACCUFET there is significant leakage current in the off-state, i.e., $V_{GS}$ is equal to zero, at a blocking voltage of as little as 8 volts, whereas a similar leakage current would only occur for the present MOSFET at a blocking voltage of 15 volts. Thus the present device is clearly superior to the ACCUFET in this regard. Also it has been found that on-state resistance for the present MOSFET is approximately the same as for comparable ACCUFETS. Hence, a superior blocking capability is achieved at no disadvantage in terms of specific on resistance compared to the ACCUFET.

As will be explained further below with reference to other embodiments, the particular shape of the depletion barrier layer as shown in FIG. 2 is not critical to the present invention, nor is its extent. That is, the depletion barrier layer may be located anywhere along the sidewalls of the gate trenches and may extend all the way from the sidewall of one trench to the sidewall of the adjacent trench, and need not extend exactly to the sidewall but may be spaced slightly apart therefrom, so long as the depletion improvement is still present. Moreover, the height (vertical extent) of the depletion barrier layer need not be any particular amount so long as it is adequate to provide the desired blocking capability. A wide range of doping levels of the depletion barrier layer also provides the desired depletion effect.

Figure 6:
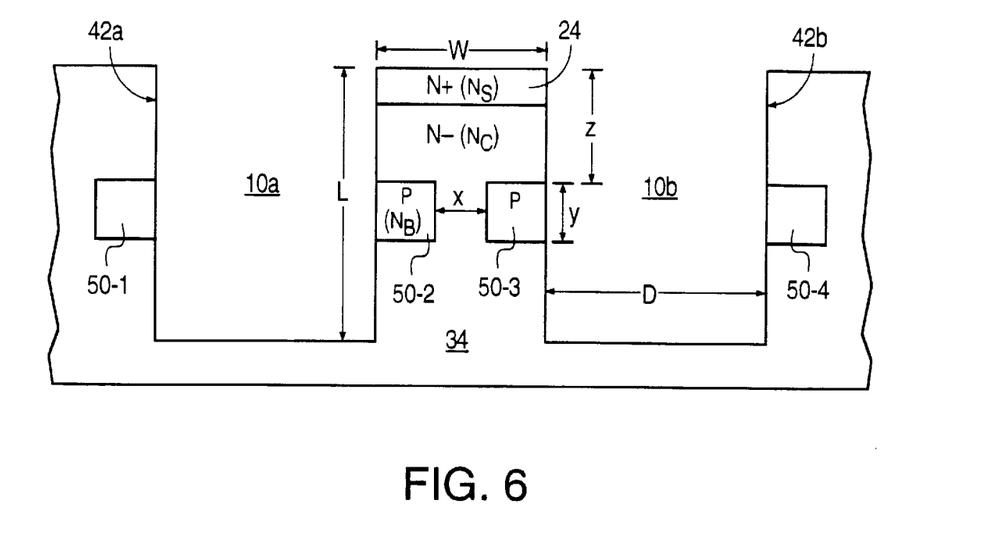
FIG. 6 shows dimensions of the MOSFET of FIG. 2.

FIG. 6 shows a somewhat schematic depiction of the structure of FIG. 2 with some structures eliminated or redrawn for simplicity, so as to depict relevant illustrative dimensions and doping (concentration) levels. The dimension L, which is the trench depth, is in the range of 0.2 to 10 microns ($\mu$m). The dimension W, which is the spacing between adjacent trenches, is also in the range of 0.2 to 10 microns. Similarly the width of the trenches, which is dimension D, is in the range of 0.2 to 10 microns. Dimension Y, which is the height of the depletion barrier layer 50-1, 50-2, 50-3, 50-4 may be any dimension greater than zero and less than L and typically is in the range of 0.2 to 2 microns.

The dimension X, which is the spacing between adjacent portions of the depletion barrier layer, is in the range zero (indicating that the depletion barrier layer extends from trench to trench) to slightly less than dimension W, in which case the width of the depletion barrier layer portions is minimal. A minimal width of each "ear" is e.g. 0.1 micron. Dimension Z, which is the depth of the depletion barrier layer relative to the principal surface of the substrate, is in the range of zero (immediately below the source region) to L, in which case the barrier layer is located adjacent the floors of the trenches.

The dopant concentration levels of portions of the present device may vary, as is typical of MOSFETs and well understood to one in the art. In typical embodiments, the doping level $N_S$ of the N+ source region 24 is in the range of $10^{17}$ to $10^{22}/\text{cm}^3$. The doping level $N_C$ of the N− lightly doped drift region 34 is in the range of $10^{13}$ to $10^{16}/\text{cm}^3$. The doping level of the P depletion barrier layer 50-1, etc. is in the range of $10^{13}$ to $10^{18}/\text{cm}^3$. The usual P type dopant is boron, but this is not limiting; neither are the above-mentioned concentration levels.

Figure 7:
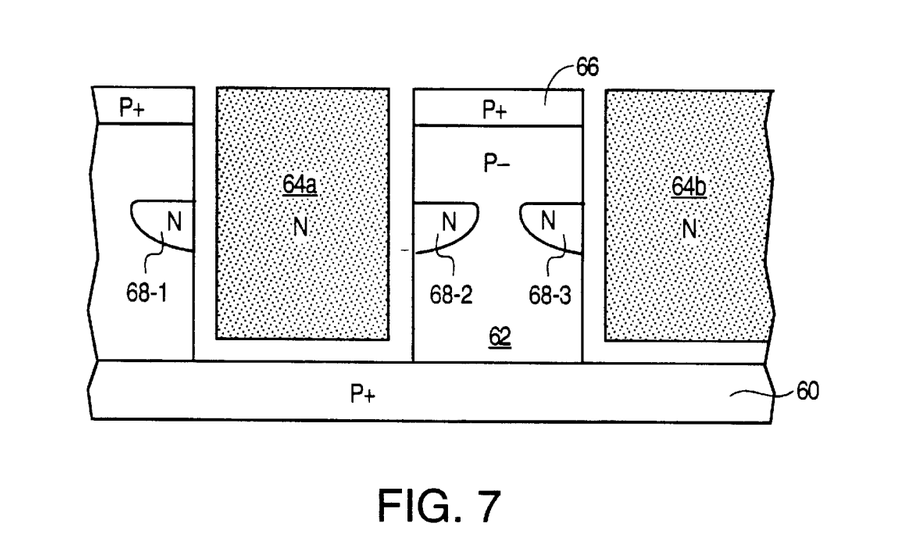
FIG. 7 shows a P-channel MOSFET complementary to that of FIG. 2.

FIG. 7 shows a P-channel MOSFET complementary in conductivity types to that of FIG. 2. This device would have the same benefits as those of FIG. 2 and would operate similarly.

In this case the substrate 60 is P+ doped while the lightly doped region 62 is P− doped and the source regions 66 are P+ doped. The depletion barrier layer 68-1, 68-2, 68-3, is N doped. Also the polysilicon gate electrodes 64a, 64b are N doped, in contrast to the P doping of the polysilicon gate electrode in the N-channel device of FIG. 2.

Figure 8:
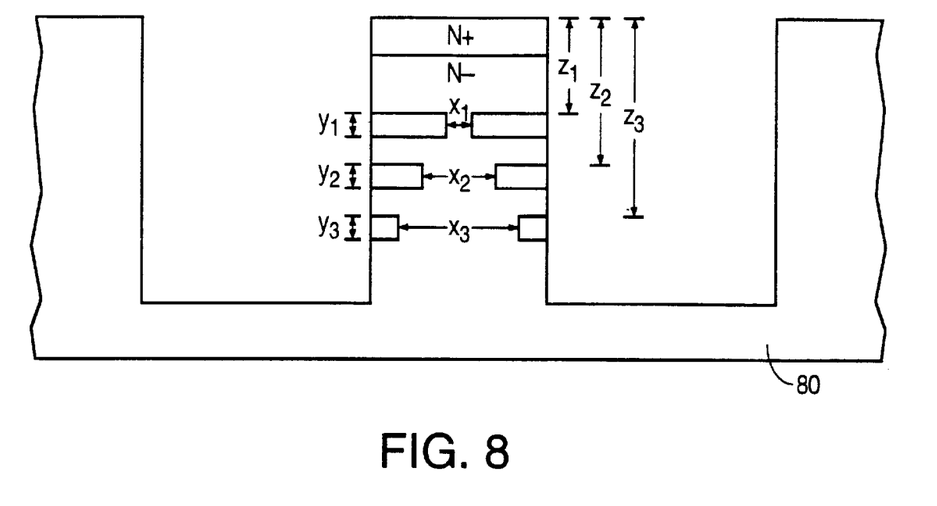
FIG. 8 shows a MOSFET having multiple depletion barrier regions in accordance with the present invention.

FIG. 8 shows (somewhat schematically) a cross section of a MOSFET in accordance with the present invention having a plurality of depletion barrier layers in substrate 80. These are designated as barrier layers $NB_1$, $NB_2$, $NB_3$ which are at varying depths respectively $z_1$, $z_2$ and $z_3$. In this case there are three barrier layers $NB_1$, $NB_2$, $NB_3$, each potentially varying in height, respectively heights $y_1$, $y_2$ and $y_3$, and each having a spacing between the two opposing "ears", in respectively spacings $x_1$, $x_2$ and $x_3$. This illustrates that it is possible to use multiple barrier layers to increase the depletion effect, and each barrier layer may have its own dimensions. Use of multiple depletion barrier layer would include in one version one depletion barrier layer near the top of the trench and one near the bottom of the trench, to provide symmetry for bidirectional characteristics. Such a device would be fabricated e.g. by multiple ion implants at different energies.

Figure 9:
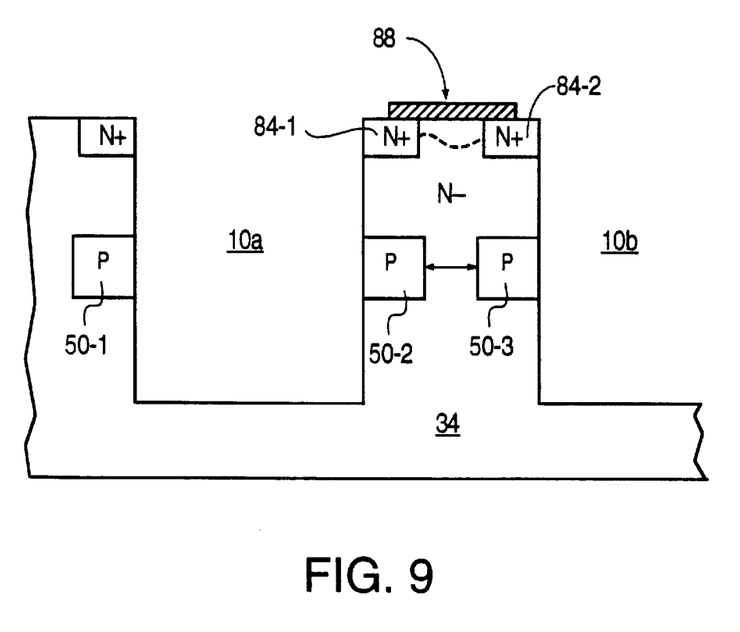
FIG. 9 shows another MOSFET in accordance with the present invention having a Schottky contact to the source regions.

FIG. 9 shows another embodiment in accordance with the present invention otherwise similar to that of FIG. 2, except that the N+ doped source region is modified so that it is formed in two portions 84-1, 84-2, separated by a portion of the N− region 34. A Schottky contact 88 is made ohmically to the source regions 84-1, 84-2 and drift region 34. Such a Schottky contact is well known in the art and in this application improves the barrier at the surface of the device. The advantage of this is to extend the barrier into the portion of the N− region 34 between the N+ source regions 84-1, 84-2.

Figure 10:
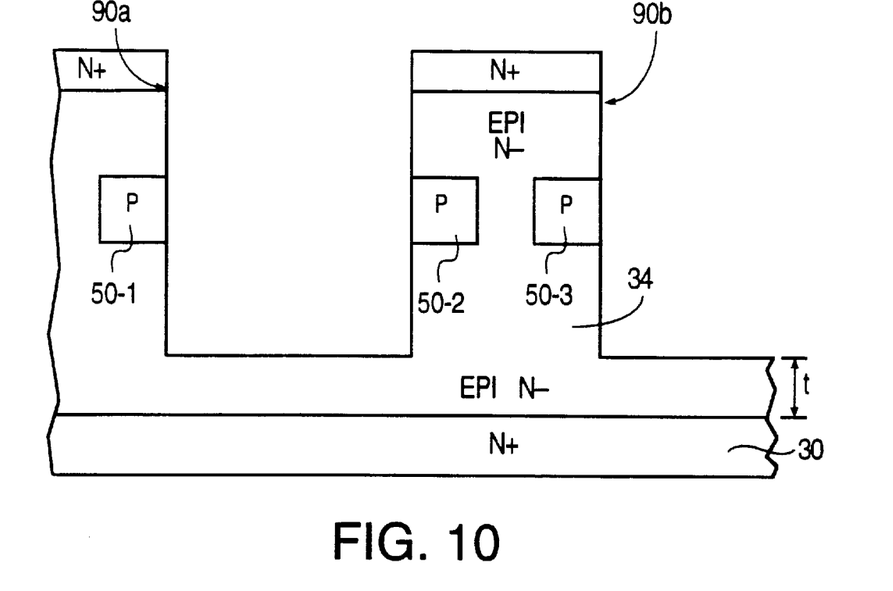
FIG. 10 shows another MOSFET in accordance with the present invention illustrating an epitaxial layer/substrate interface.

FIG. 10 shows somewhat schematically yet another embodiment in accordance with the present invention. Here the depletion barrier layer 50-1, 50-2, 50-3 is as in FIG. 2; however, in this case the trenches 90a, 90b do not penetrate all the way down to the upper portion of the N+ drain region 30, but instead only extend down partly through the N− region 34 (which is in this case an epitaxial layer). The dimension t between the floor of the trenches 90a, 90b and the upper portion of the N+ drain region 30 may be any dimension, as determined by process or other limitations.

This structure allows the depletion barrier to extend down further below the trench floors into the lower portion of the region 34. The advantage of this is increased blocking capability, at the expense of on-state specific resistance.

Figure 11:
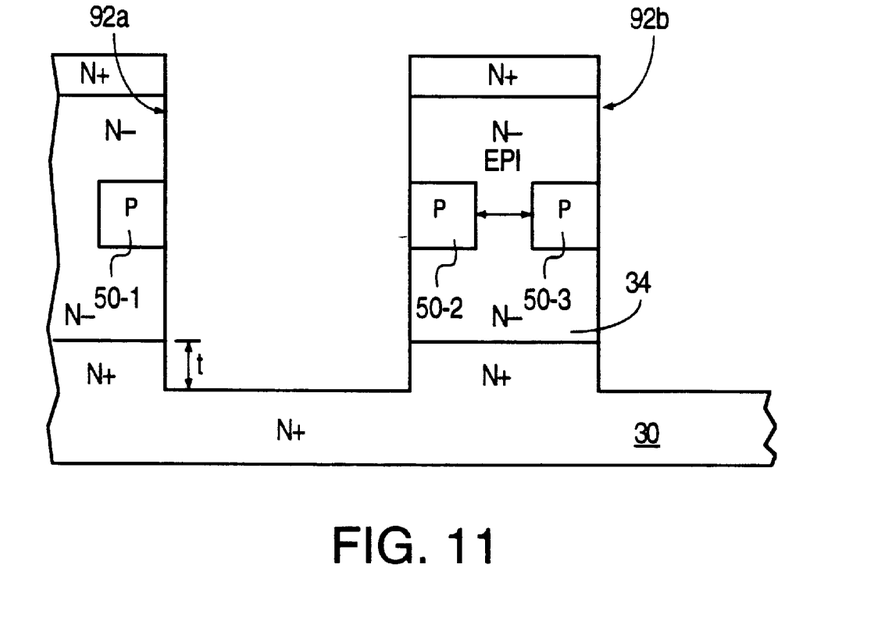
FIG. 11 shows another MOSFET in accordance with the present invention illustrating the trench penetrating into the lower portion of the substrate.

FIG. 11 shows yet another embodiment in accordance with the present invention. In this case the trenches 92a, 92b extend down into the lower portion of the device, i.e. into the N+ drain region 30 by a depth t which may be any dimension as determined by the maximum trench depth. The advantage of this is to guarantee extension of the trench into the drain region.

Figure 12A:
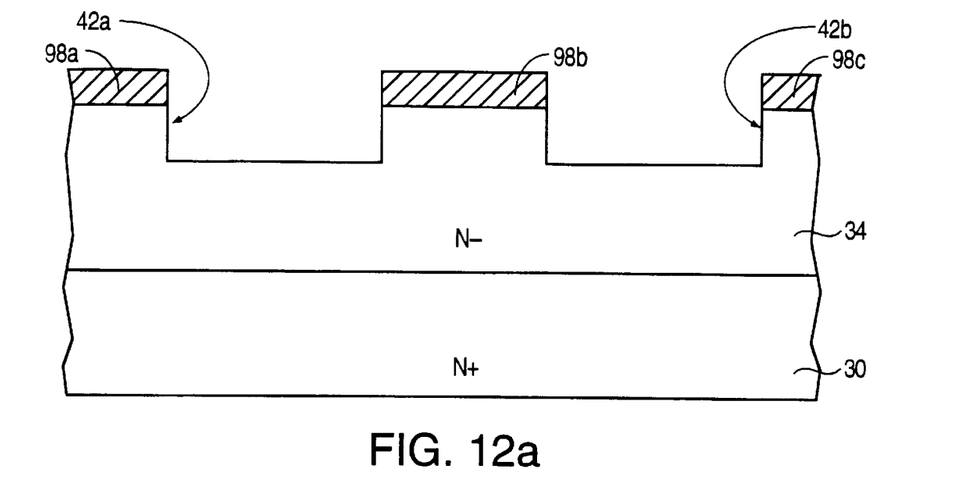
FIGS. 12a–12c show steps in fabrication of a MOSFET in accordance with the present invention.
Figure 12B:
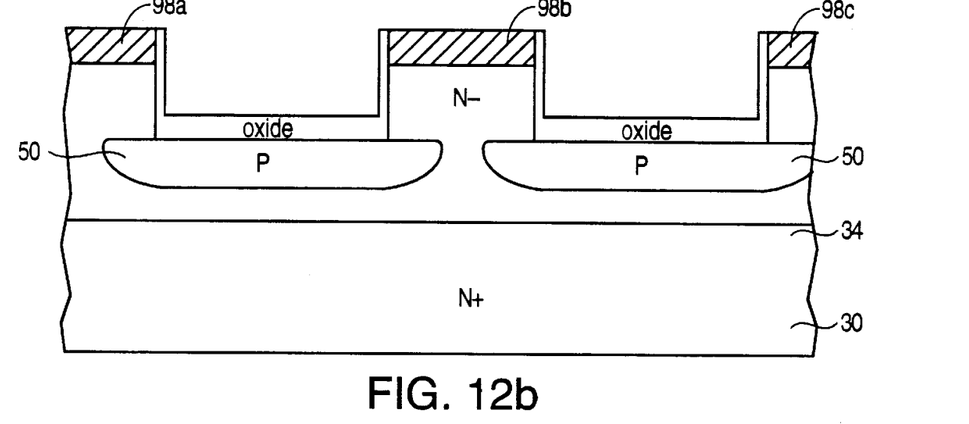
Figure 12C:
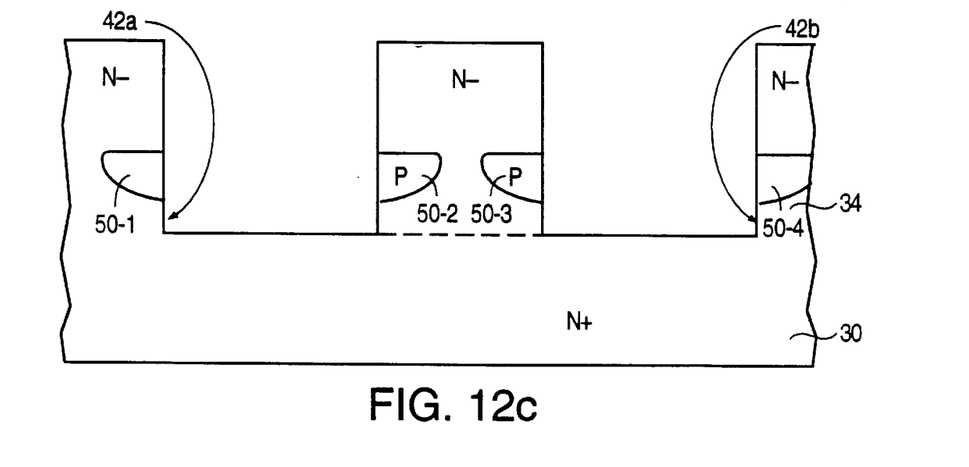

FIGS. 12a through 12c show process steps to fabricate the MOSFET of FIG. 2 (and with readily apparent modifications the MOSFETs of FIGS. 7, 8, 9, 10, and 11). These steps individually are conventional. FIG. 12a begins with an N+ doped substrate 30, on which is grown an N− doped epitaxial layer 34 having a thickness of 2 microns. Then a "hard" mask (for instance oxide) is formed over the principal surface of layer 34 and patterned into portions 98a, 98b, 98c to define the trench openings. Then the trenches are anisotropically etched to form the straight sided trenches 42a, 42b shown.

Then in FIG. 12b after an additional layer of silicon dioxide ("oxide" is grown lining the trenches 42a,42b, boron is implanted at an energy level in the range of 30 to 80 KEV and driven in to form the P doped depletion barrier layer 50 having a doping concentration in the range of $10^{13}$ to $10^{18}/cm^3$, as described above. In this case the hard mask 98a, 98b, 98c extending between each two adjacent trenches prevents the boron atoms from being implanted immediately below the mask 98a, 98b, 98c; however, the drive in step drives the boron atoms so that they extend laterally beyond the trench sidewalls. The extent to which the boron atoms extend laterally is determined by the implant energy and the drive in step parameters, thus determining how close the two adjacent portions of the depletion barrier layer approach one another after drive in.

Next as shown in FIG. 12c, a second etch step is performed using the same hard mask as before to extend the trenches 42a, 42b downward further through the implanted P depletion barrier layer 50, thus eliminating a substantial part of P layer 50 but leaving the characteristic "ears" 50-1, 50-2, 50-3, 50-4 extending from the sidewalls of each trench. Thus this structure can be identified with that of FIG. 2.

The transistor is then completed conventionally (not shown) by stripping off the hard mask 98a, 98b, 98c, growing the gate oxide, filling the trenches with polysilicon, doping the polysilicon, patterning the polysilicon to form the gate electrodes, and then using a mask to form the N+ source regions (not shown). The passivation is formed, and then the metallization is formed to contact the source region and the drain region as shown in FIG. 2.

Figure 13:
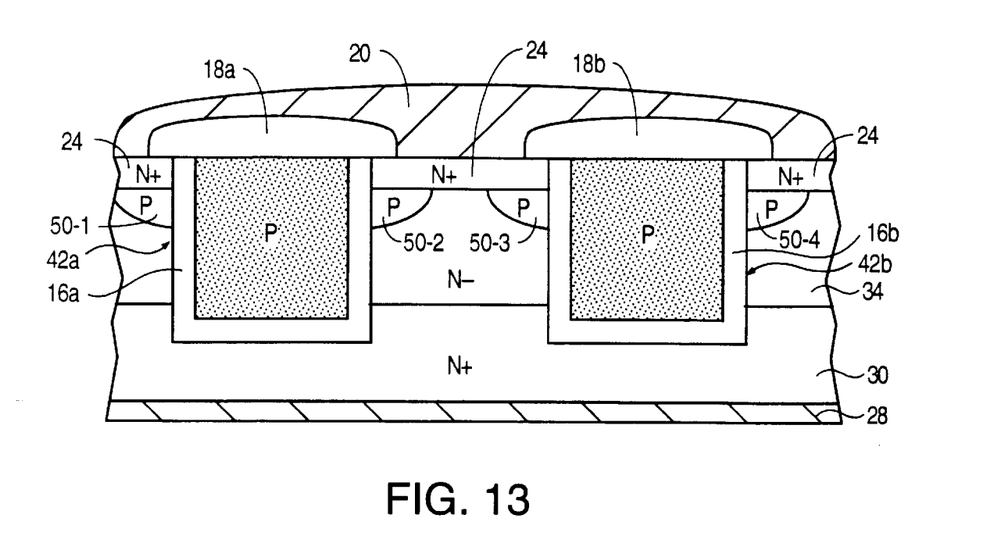
FIG. 13 shows another MOSFET in accordance with the present invention with the barrier layer immediately under the source region.

FIG. 13 shows yet another embodiment fabricated by a process different from that shown in FIGS. 12a to 12c but similar in structure to that of FIG. 2, except that the depletion barrier layer 50-1, 50-2, 50-3, 50-4 is not formed midway on the sidewalls of the trenches 42a, 42b, but instead is formed adjacent the upper portion of the trench sidewalls and immediately below the N+ source regions 24. It has been found that this structure provides the benefits of the depletion barrier layer without the need for the double trench etch steps of FIG. 12.

Figure 14:
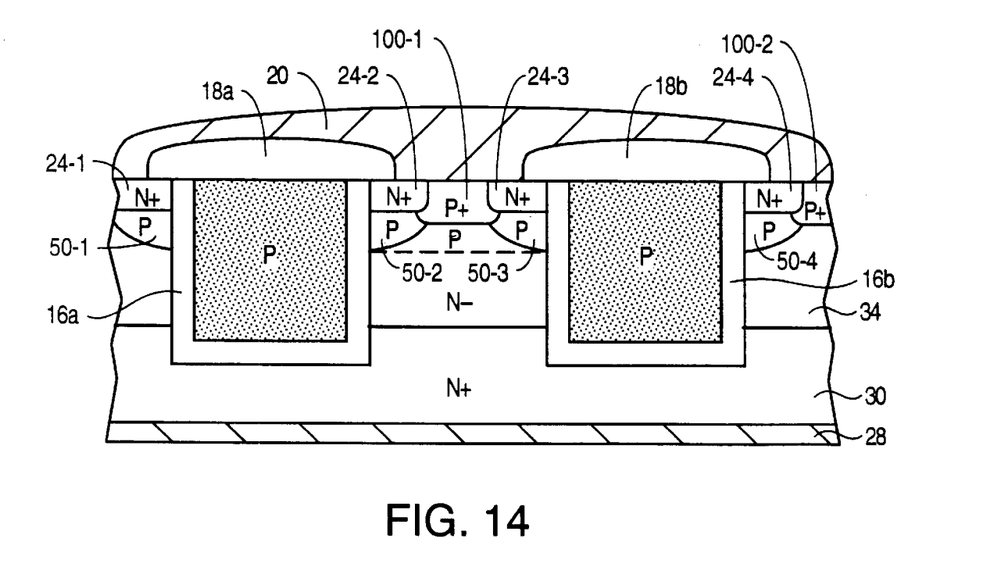
FIG. 14 shows another MOSFET in accordance with the present invention with the barrier layer located immediately under the source region.

A variant of the MOSFET of FIG. 13 is shown in FIG. 14. In this case, in addition to the P depletion barrier layer 50-1, 50-2, 50-3, 50-4 formed adjacent the upper portions of the trench sidewalls, there is also a P+ region 100-1, 100-2 adjacent the principal surface of the substrate and located between each two portions of the source region. This P+ region, in combination with the adjacent source region, forms a PN diode and increases the barrier laterally and vertically.

For the MOSFETs of FIGS. 13 and 14, the depletion barrier layer is formed by a high energy implant so as to be located immediately below the N+ doped source regions 24 and has a typical doping level of $10^{16}/cm^3$ or less. The N− region 34 has a typical doping level of $10^{14}/cm^3$. In this case the trenches are formed by a conventional single trench etch process. The P depletion barrier layer 50-1, 50-2, 50-3, 50-4 is implanted (using a suitable separate mask) prior to etching the trenches. The trenches are then etched through the P depletion barrier layer.

It is to be understood that while conventional ACCUFET termination structures (not shown) may be used in accordance with the present invention, other termination structures may be used to isolate the active portion of the MOSFET. The termination isolation prevents drain to source shorting. In one embodiment, an isolation structure (for a closed cell MOSFET) is formed in the perimeter of the transistor and surrounding the transistor; the termination includes dummy cells (having no source contact). Alternatively or additionally, the polysilicon gate structures in the dummy cells are isolated from the active cell gate structures. For a linear (interdigitated) MOSFET cell structure, termination isolation moats are provided to close off the ends of the cells.

This disclosure is illustrative and not limiting; further modifications will be apparent to one of ordinary skill in the art in light of this disclosure and are intended to fall within the scope of the appended claims.

We claim:

1. A field effect transistor formed in a semiconductor material having a first conductivity type and having a principal surface, and comprising:

at least two trenches, spaced apart from one another, each trench extending into the semiconductor material from the principal surface;

a conductive gate electrode of a second conductivity type in each trench;

a source region of the first conductivity type and extending into the semiconductor material from the principal surface, between the two trenches; and a barrier region associated with each of the trenches and being of the second conductivity type, and in contact with the semiconductor material and underlying the source region and wherein each barrier region extends from a sidewall of the associated trench towards the barrier region associated with the other trench, there being a portion of the semiconductor material of the first conductivity type laterally spacing apart the barrier regions and wherein each barrier region is located intermediate a floor of the associated trench and the principal surface, wherein each barrier region is electrically floating and is insulated from the gate electrode and has no voltage impressed thereon and is spaced apart from the source region.

2. The field effect transistor of claim 1, wherein each barrier region extends only part way between the source region and a floor of the associated trench.

3. The field effect transistor of claim 1, each barrier region having a doping concentration in a range of $10^{13}$ to $10^{18}/cm^3$.

4. The transistor of claim 1, wherein the source region is in two spaced apart portions, and further comprising:
   a region of the second conductivity type lying between the two portions of the source region, and
   a region of the second conductivity type lying between the two portions of the first barrier region.

5. The transistor of claim 1, wherein the source region is in two spaced apart portions.

6. The transistor of claim 1,
   wherein the semiconductor material comprises a lower portion and an upper portion, the lower portion being more heavily doped than the upper portion and the trenches extending to and not into the lower portion.

7. The transistor of claim 1, wherein the semiconductor material comprises a lower portion and an upper portion, the lower portion being more heavily doped than the upper portion, the trenches extending into the upper portion and being spaced apart from the lower portion.

8. The transistor of claim 1, wherein the semiconductor material comprises a lower portion and an upper portion, the lower portion being more heavily doped than the upper portion, the trenches extending into the lower portion.

9. The transistor of claim 1, further comprising a termination laterally surrounding an active portion of the transistor at the principal surface, the termination isolating the active portion of the transistor.

10. A field effect transistor formed in a semiconductor material having a first conductivity type and having a principal surface, and comprising:
    at least two trenches, spaced apart from one another, each trench extending into the semiconductor material from the principal surface;
    a conductive gate electrode in each trench;
    a substrate region underlying the trenches and doped to have the first conductivity type to a greater doping concentration than the semiconductor material;
    a source region of the first conductivity type and extending into the semiconductor material from the principal surface, between the two trenches and of greater doping concentration than the semiconductor material; and
    a barrier region associated with each of the trenches and being of a second opposite conductivity type and in the semiconductor material underlying and spaced apart from the source region and wherein each barrier region extends from a sidewall of the associated trench and towards the barrier region associated with the other trench, there being a portion of the semiconductor material of the first conductivity type laterally spacing apart the barrier regions and wherein each barrier region is located intermediate a floor of the trench and the principal surface, the barrier region having a doping concentration substantially less than that of the substrate region and being electrically floating, there being no voltage impressed thereon.

11. A field effect transistor formed in a semiconductor material having a first conductivity type and having a principal surface, and comprising:
    at least two trenches, spaced apart from one another, each trench extending into the semiconductor material from the principal surface;
    a conductive gate electrode of a second opposite conductivity type in each trench;
    a source region of the first conductivity type and extending into the semiconductor material from the principal surface, between the two trenches;
    a first barrier region of the second conductivity type in contact with the semiconductor material and underlying the source region and between the two trenches, wherein the first barrier region is electrically insulated from the gate electrode and is spaced apart from the source region; and
    a second barrier region of the second conductivity type in the semiconductor material below the source region and between the two trenches, and spaced apart from the first barrier region and located nearer the source region than is the first barrier region.

12. The field effect transistor of claim 11, wherein the first barrier region is in two portions, each portion extending from a sidewall of one of the trenches.

13. The transistor of claim 11, wherein the first barrier region extends from a sidewall of a first of the two trenches to a sidewall of a second of the two trenches.

14. The transistor of claim 11, wherein the first barrier region is in two portions, a first portion adjacent a sidewall of a first of the two trenches and the second portion adjacent a sidewall of the second of the two trenches.

* * * * *